United States Patent [19]

Klicker et al.

[11] 4,412,148
[45] Oct. 25, 1983

[54] PZT COMPOSITE AND A FABRICATION METHOD THEREOF

[75] Inventors: Kenneth A. Klicker, Whitehall; Robert E. Newnham, State College; Leslie E. Cross, State College; James V. Biggers, State College, all of Pa.

[73] Assignee: The United States of America as represented by the Secretary of the Navy, Washington, D.C.

[21] Appl. No.: 257,289

[22] Filed: Apr. 24, 1981

[51] Int. Cl.³ ............................................. H01L 41/08
[52] U.S. Cl. .................... 310/358; 310/357; 310/311; 310/800
[58] Field of Search ............... 310/311, 800, 357–359; 252/62.9

[56] References Cited

U.S. PATENT DOCUMENTS

| | | | |
|---|---|---|---|
| 2,420,864 | 5/1947 | Chilowsky | 310/357 X |
| 3,070,775 | 12/1962 | Andrews, Jr. | 310/357 X |
| 3,213,027 | 10/1965 | Fatuzzo et al. | 310/357 |

FOREIGN PATENT DOCUMENTS

| | | | |
|---|---|---|---|
| 54-105799 | 8/1979 | Japan | 310/357 |
| 54-120899 | 9/1979 | Japan | 310/357 |
| 54-120900 | 9/1979 | Japan | 310/357 |

Primary Examiner—Mark O. Budd
Attorney, Agent, or Firm—Robert F. Beers; Arthur A. McGill; Prithvi C. Lall

[57] ABSTRACT

A composite of PZT (Lead Zirconate Titanate) and a compliant polymer matrix having 3-1 connectivity (i.e., in a diphasic material, one of the two phases is continuously self-connected in all three mutually perpendicular directions and the second phase is self-connected only along one of the three mutually perpendicular directions) and fabrication method thereof is described. An array of parallel PZT rod elements is embedded in a mechanically compliant polymer matrix with their axes along the direction of the poling electric field. Such a composite has a high value of $\bar{g}_h$, $\bar{d}_h$ and $\bar{g}_{33}$ with very little sacrifice in the value of $\bar{d}_{33}$.

4 Claims, 6 Drawing Figures

PZT COMPOSITE AND A FABRICATION METHOD THEREOF

BACKGROUND OF THE INVENTION

This invention is related to piezoelectric materials and, more particularly, to a 3-1 phase connected PZT polymer composite for transducer applications and the like.

A widely used piezoelectric transducer is made from solid lead zirconate titanate (PZT) which is a dense (density 7.9 gm/cc) ceramic with high piezoelectric coefficients $d_{33}$ and $d_{31}$ and a high dielectric permittivity ($\epsilon_{33}$). However, solid PZT is a poor transducer material in some respects as coefficients such as piezoelectric voltage coefficients $g_{33}$ and $\bar{g}_h$ are low due to high dielectric permittivity $\bar{\epsilon}_{33}$. The coefficient $\bar{d}_h$ which is the difference between $\bar{d}_{33}$ and twice $\bar{d}_{31}$ is also low. It is thus desirable to have a material for transducer fabrication which has high values of $\bar{g}_h$, $\bar{d}_h$. It is further desirable to have a low density material for transducers which are used in an array which is to be towed behind a ship. Furthermore, a low density material for transducer fabrication is also required for good mechanical coupling with seawater. It is thus desirable to have a PZT composite material using an elastomer which will meet the above requirement for a flexible transducer.

SUMMARY OF THE INVENTION

A PZT-polymer composite according to the teachings of subject invention is fabricated so that an array of parallel PZT strands or rods are embedded in a mechanically compliant matrix of a polymer such as an epoxy. Such a composite has high values of $\bar{g}_{33}$, $\bar{g}_h$ and $\bar{d}_h$ with comparatively little sacrifice in the value of $\bar{d}_{33}$. Such a material is fabricated by extruding small strands or rods of PZT powder mixed with an organic binder. The extruded rods are then fired to obtain sintered PZT rods or strands. A hot isostatic (HIP) is sometimes used to densify the sintered PZT rods. The PZT strands so obtained are embedded in an epoxy using two metallic plates or discs kept a certain distance apart by a supporting rod in order to embed the PZT strands in the epoxy to form a slug. The slug is then sectioned off to form PZT-polymer composite wafers in which sintered PZT rods are embedded parallel to one another. The wafers are then electrically poled in a direction parallel to the axes of the PZT strands to form transducers and the like.

An object of the subject invention is to fabricate a PZT-polymer composite for transducer fabrication.

Another object of the subject invention is to fabricate a PZT-polymer composite which has high hydrostatic voltage coefficient $\bar{d}_h$.

Still another object of the subject invention is to fabricate a PZT-polymer composite which has relatively low density.

An additional object of the subject invention is to fabricate a PZT-polymer composite wherein the electric permittivity ($\bar{\epsilon}_{33}$) and the voltage coefficient $\bar{d}_{33}$) are not drastically affected.

Still another object of the subject invention is to obtain a transducer material which remains afloat while being towed in the form of an array of transducers made therefrom.

Other objects, advantages and novel features of the invention will become apparent from the following detailed description thereof when considered in conjunction with the accompanying drawings wherein:

DESCRIPTION OF A PREFERRED EMBODIMENT

Figure 1:
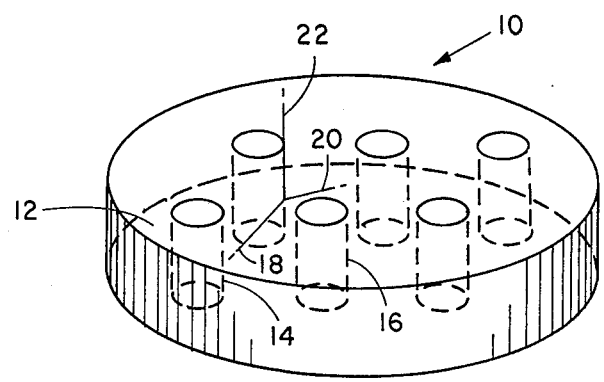
FIG. 1 is a schematic representation of a PZT-polymer material having 3-1 connectivity.

FIG. 1 is a schematic representation of a piece 10 of PZT-polymer composite built according to the teachings of the subject invention. Polymer matrix 12 has a plurality of PZT rods such as 14 and 16 embedded therein and polymer matrix 12 has orthogonal axes, 18, 20 and 22 as shown in FIG. 1. The orientation of the plurality of thin PZT rods such as 14 and 16 is such that each rod has its longitudinal axis parallel to axis 22. Axis 22 is also used as the poling direction for electrically poling the plurality of PZT rods.

Figure 2:
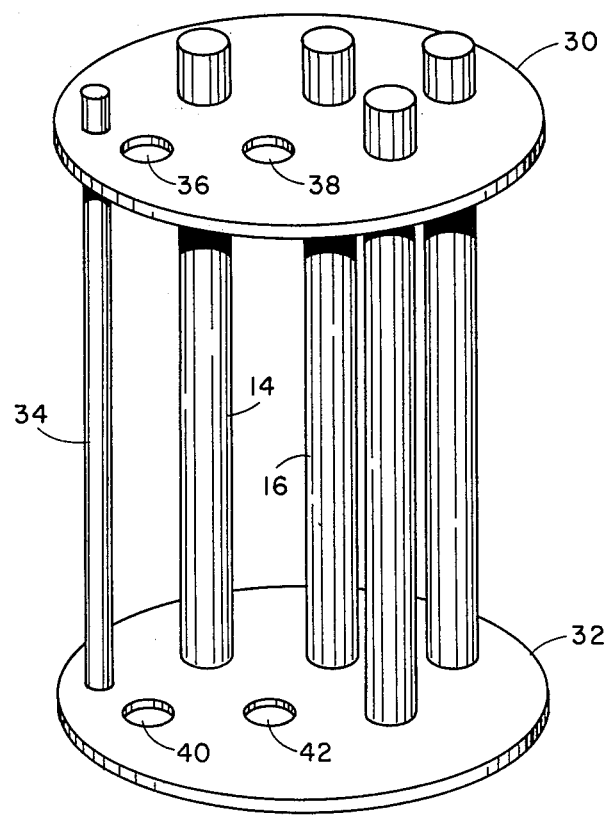
FIG. 2 is a schematic representation of an arrangement which is used during the fabrication of a PZT-polymer composite.

FIG. 2 schematically shows a structure including metallic plates or discs 30 and 32, preferably made of brass or the like which are mechanically supported by a metallic rod 34. Plates 30 and 32 have a plurality of holes such as holes 36 and 38 in plate 30 and their corresponding holes 40 and 42 in plate 32. The structure shown in FIG. 2 is used to align sintered PZT rods. A 90 weight percent PZT-powder is mixed by hand in a plastic jar with a solution of 20 weight percent polyvinyl alcohol (PVA) and 80 weight percent water. The mixture is put in a jar which is tightly capped and put onto a ball mill rack and is allowed to spin for approximately 16 hours. The spinning helps to homogonize the batch. Further homogonization is achieved by extruding the batch through a 50 mm die several times and PZT rods or strands of different diameters are then extruded onto a moving glass plate. The rods are dried on the glass plates for about 10 hours at 120° C. Dry rods are then cut into 3 centimeter lengths, laid on a platinum sheet and the binder is burned out at 155° C. for about ½ hour. Sintering is accomplished in a sealed aluminum crucible at 1300° C. for about ½ hour. A PbO vapor source of composition 97 mole percent (%) 501A and 3 mole percent (%) PbO is included in the crucible. To reduce any porosity, all sintered rods are re-fired in a hot isostatic press (HIP) for about one hour at 1300° C. under a pressure of 200 atmospheres of argon.

It should be noted that the size of the holes such as 36, 38, 40 and 42 in discs 32 and 34 is varied to accommodate PZT rods of different diameters. Discs 30 and 32 are held a fixed distance apart by means of a metallic rod 34 acting as a mechanical support therebetween. The PZT rods are then aligned in the plurality of holes in discs 30 and 32. The polymer used is preferably an epoxy. However, it should be clearly understood that some other polymer can be used without any deviation from the teachings of the subject invention. After the rack comprising discs 30, 32 and rod 34, is filled with finished PZT rods, it is placed in a plastic tube with two closed ends. The plastic tube preferably has a slot cut into one side in order to pour the epoxy around the PZT rods. In order to assure complete investment of the PZT rods by the epoxy, an apparatus is used which placed the plastic tube and its contents under vacuum while the epoxy is poured into the plastic tube. The epoxy is then cured at approximately 70° C. for about 16 hours to form a slug inside the plastic tube. Pieces or wafers of thicknesses 1 to 4 mm are cut from the slug with a diamond saw. The excess epoxy around the composite is cut off so that only the composite volume remains.

Air dry silver electrodes are applied and the wafers are poled electrically in a 75° C. oil bath with a field of 22 kilovolts per centimeter (KV/cm) for about 5 minutes. Permittivity is measured at one kilohertz (KhZ). Constant $\bar{d}_{33}$ is measured with a $\bar{d}_{33}$ meter such as model CPDT 3300 from Channel Products, Cleveland, Ohio. The hydrostatic piezoelectric coefficients $(\bar{d}_h)$ is measured by changing pressure in an oil chamber at the rate of 500 pounds per square inch per second (500 psi/sec) and collecting the charge with an electrometer in the feedback integration mode which maintains nearly zero sample potential. In order to accommodate for possible influence of irreversible polarization and current effects, the values recorded are obtained from many runs utilizing both increasing and decreasing pressures.

Figure 3:
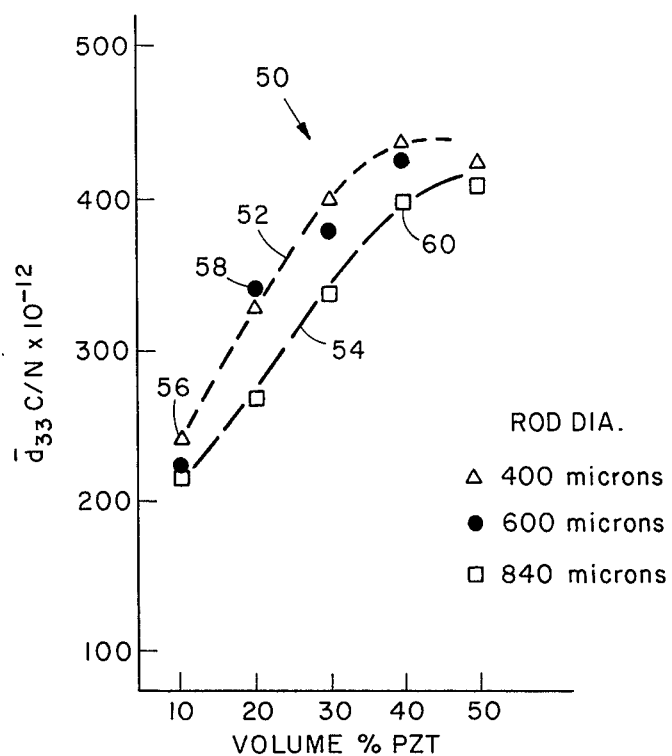
FIG. 3 is a graphical representation showing variation of $d_{33}$ as volume percentage of PZT % therein.
Figure 4:
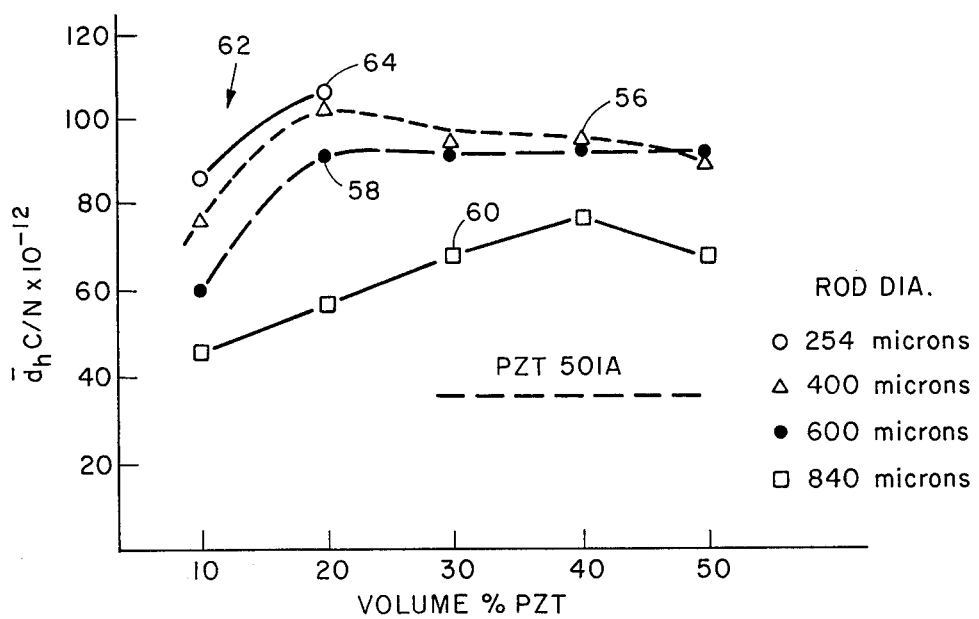
FIG. 4 is a graphical representation of the variation of $d_h$ for the composite material as a function of volume percentage of PZT present therein.
Figure 5:
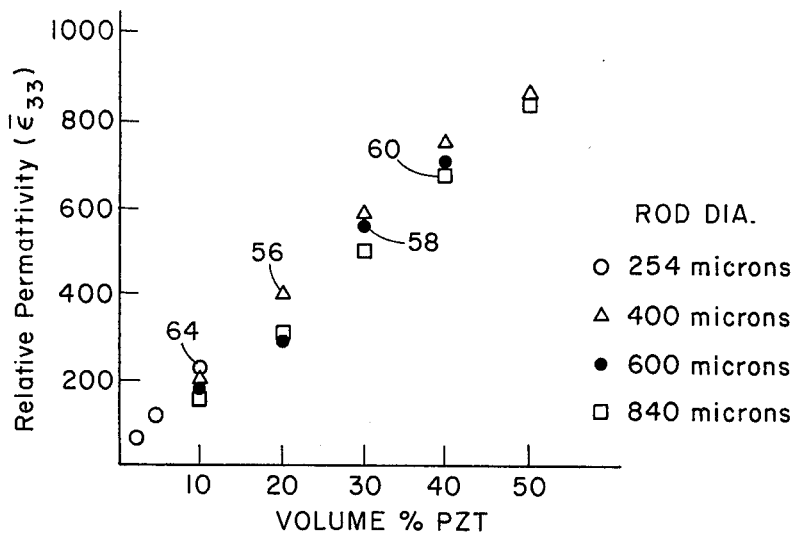
FIG. 5 is a graphical representation of variation of relative permittivity of the composite as a function of volume of percentage PZT present therein.
Figure 6:
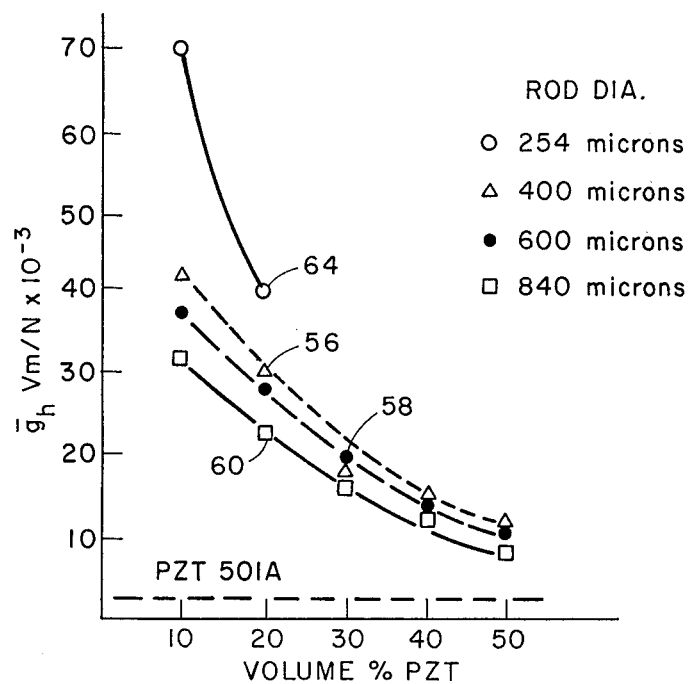
FIG. 6 is a graphical representation $\bar{g}_h$ as a function of volume percentage PZT.

FIG. 3 is a graphical representation 50 of variation dynamic $$\bar{d}_{33}\left[\frac{\text{coulomb}}{\text{newton}} \times 10^{-12}\right]$$

with volume percentage of PZT. Curves 52 and 54 are shown for PZT rods of diameters 400 microns, (1 micron, $\mu = 10^{-6}$ meter), 600 microns and 840 microns which are respectively plotted as points represented by 56, 58 and 60. As can be seen from FIG. 3, $\bar{d}_{33}$ for the PZT-polymer composite does not change appreciably up to 70 percent epoxy replacing PZT. FIG. 4 is a graphical representation 62 of the variation of $$\left[\bar{d}_h \frac{\text{coulomb}}{\text{newton}} \times 10^{-12}\right]$$

with volume percentage of PZT. It is to be noted that composites using PZT rods of smaller diameter have a high value of $\bar{d}_h$. Each experimental point such as 56, 58, 60 and 64 represents data for a PZT rod of diameter 254$\mu$, 400$\mu$, 600$\mu$ and 840$\mu$ (1$\mu = 10^{-6}$ meter) respectively. As can be readily seen, the values of $\bar{d}_h$ are much higher than the corresponding values for solid PZT 501A. It is further to be noted that the value of $\bar{d}_h$ and other constants is also dependent upon the nature of PZT powder (soft or hard) used although the general nature of variation essentially remains the same. FIG. 5 is a graphical representation of the variation of relative permittivity ($\bar{\epsilon}_{33}$) with volume percentage of PZT. As it can be seen from FIG. 5, the desired reduction in $\bar{\epsilon}_{33}$ is accomplished with low volume percentage of PZT and this trend is again more noticeable with low diameter PZT rods. FIG. 6 is a graphical representation of the variation of voltage coefficient $\bar{g}_h$ ($\bar{g}_h = \bar{d}_h/\bar{\epsilon}_{33}$) as a function volume percentage of PZT. FIG. 6 indicates an increased value of $g_h$ with a decrease in volume percentage of PZT. Here again the value of $\bar{g}_h$ is much higher for PZT rods of relatively low diameter. It can thus be seen that most of the desirable characteristics are achieved by a PZT-polymer composite wherein PZT rods of small diameter are embedded in a polymer such as an epoxy. It should be noted that the density of the PZT-polymer composite can be obtained by the following equation:

Density of the PZT-Epoxy composite =

$$7.9 \frac{\text{gms}}{\text{cm}^3} \times \text{volume percentage of } PZT +$$

$$1.1 \frac{\text{gms}}{\text{cm}^3} \times \text{volume percentage of epoxy}$$

It should further be noted that the greatest values of $\bar{d}_h$, $\bar{g}_h$ and $\bar{g}_{33}$ are all found in the composites with low volume fractions of PZT. This indicates that the desired properties of low density and high charge or high voltage coefficients may be obtained with the same composite.

Briefly stated, a PZT-polymer composite having 3-1 connectivity for fabricating piezoelectric transducers is obtained by embedding PZT rods of relatively small diameters into a polymer such as an epoxy with the PZT rods electrically poled along the longitudinal axis thereof.

Obviously, many modifications and variations of the present invention are possible in the light of the above teachings. As an example, the production of the composites is not limited to the use of extruded rods. Rods, bars, fibers or other small PZT elements for alignment in a 3-1 composite may be made by other techniques such as supplying of a sintered PZT part, dipping of cloth thread in a PZT slip or solution or spraying a thread with a PZT slip and then burning out the thread and sintering the PZT. Furthermore, a sintered PZT slug may be cut in a criss-cross manner with a diamond saw to produce an array of PZT columns of desired dimensions and spraying. Thus, the manner in which the rods are produced or the manner in which the rods are aligned is not important. Additionally, the PZT powder used can be either soft or hard to fabricate PZT-polymer composite. Furthermore, composites may be made with a matrix other than epoxy. It has been found that a matrix of a polyester resin results in values of $\bar{d}_{33}$, $\bar{g}_{33}$, $\bar{d}_h$ and $\bar{g}_h$ comparable to those with composites of the epoxy matrix. Furthermore, composites can be made using elastomers such as foamed polyurethane which is more sensitive to low pressures than epoxy. The use of such elastomers allows for the possibility of making a flexible composite transducer. However, due to the difficulty of cutting or sawing a thick composite of PZT and an elastomer without breaking the PZT elements, such composites need by cast as a single composite.

It is, therefore, understood that within the scope of the appended claims, the invention may be practiced otherwise than as specifically described.

What is claimed:
1. A PZT-polymer composite material of 3-1 connectivity which comprises:
   a matrix of a polymer;

a plurality of PZT rods embedded in said matrix of the polymer each member of said plurality of PZT rods having the longitudinal axis thereof aligned in the same direction; and means for electrically poling said PZT material with poling field parallel to the direction of the axes of said plurality of PZT rods.

2. The PZT-polymer composite material of claim 1 wherein said plurality PZT rods are dispersed throughout said matrix of the polymer.

3. The PZT-polymer composite material of claim 2 wherein said plurality of PZT rods are of variable diameter for obtaining desired characteristics of said PZT-polymer composite material.

4. The PZT-polymer composite material of claim 3 which includes silver electrodes on opposite surfaces thereof, said opposite surfaces being generally perpendicular to the axes of said plurality of PZT rods.

* * * * *